United States Patent
Kawai

(10) Patent No.: US 8,242,385 B2
(45) Date of Patent: Aug. 14, 2012

(54) ELECTRONIC CIRCUIT UNIT

(75) Inventor: Satoshi Kawai, Miyagiken (JP)

(73) Assignee: Alps Electric Co., Inc., Tokyo (JP)

( * ) Notice: Subject to any disclaimer, the term of this patent is extended or adjusted under 35 U.S.C. 154(b) by 260 days.

(21) Appl. No.: 12/826,276

(22) Filed: Jun. 29, 2010

(65) Prior Publication Data

US 2011/0000707 A1 Jan. 6, 2011

(30) Foreign Application Priority Data

Jul. 1, 2009 (JP) .................................. 2009-157071

(51) Int. Cl.
*H05K 1/11* (2006.01)
(52) U.S. Cl. ........................................ 174/266; 174/262
(58) Field of Classification Search .................. 174/261, 174/262, 266, 264; 361/777, 788, 794; 29/877, 29/847, 825
See application file for complete search history.

(56) References Cited

U.S. PATENT DOCUMENTS

| | | | |
|---|---|---|---|
| 6,599,562 B2 * | 7/2003 | Matsuda et al. | 427/97.2 |
| 6,853,091 B2 | 2/2005 | Miyajima | |
| 7,239,527 B1 * | 7/2007 | Goergen | 361/788 |
| 2003/0153204 A1 | 8/2003 | Hirose | |
| 2008/0142258 A1 * | 6/2008 | Caletka et al. | 174/264 |
| 2010/0108369 A1 * | 5/2010 | Tom | 174/260 |
| 2012/0090884 A1 * | 4/2012 | Huang et al. | 174/266 |

* cited by examiner

*Primary Examiner* — Yuriy Semenenko
(74) *Attorney, Agent, or Firm* — Brinks Hofer Gilson & Lione

(57) ABSTRACT

An electronic circuit unit includes a multi-layer substrate in which high frequency circuits are provided on two different layers and a ground layer is formed between the two layers, and grounding lands connected to peripheral conductive members through connection bars formed on a plurality of layers of the multi-layer substrate. The grounding lands are connected to each other through a via hole and conducted to the ground layer, and the connection bars protruding radially outward from at least two grounding lands provided on different layers are arranged in different directions with respect to a circumferential direction such that the connection bars do not overlap each other along a thickness direction of the multi-layer substrate.

2 Claims, 2 Drawing Sheets

ELECTRONIC CIRCUIT UNIT

CROSS REFERENCE TO RELATED APPLICATION

The present invention contains subject matter related to and claims priority to Japanese Patent Application JP 2009-157071 filed in the Japanese Patent Office on Jul. 1, 2009, the entire content of which is incorporated herein by reference.

BACKGROUND

1. Technical Field

The present disclosure relates to an electronic circuit unit provided with a multi-layer substrate in which high frequency circuits are provided on two different layers and a ground layer is formed between the two layers. More particularly, the present disclosure relates to an improvement of a grounding land provided in a multi-layer substrate.

2. Related Art

In an electronic circuit unit in which high frequency circuits are provided on two different layers (e.g., upper and lower outer layers) in a multi-layer substrate, a large ground layer (a ground conductive layer) formed between these two layers is electrically connected to grounding lands, which are provided on each layer, through a via hole formed through layers. In this type of electronic circuit unit, when the grounding lands are formed at the approximate center thereof with a mounting hole, grounding terminals and the like of electrical parts are inserted into the mounting hole so as to be soldered to the grounding lands. Further, conductive balls connected to grounding terminals and the like of chip parts are mounted on the grounding lands so as to be soldered thereto.

However, when the terminals of electrical parts and the conductive balls are soldered to the grounding lands formed on the outer layers of the multi-layer substrate, cream solder on the grounding lands is molten by heating. When the grounding lands are formed as an exposure portion of an electrode surrounded by solder resist covering a peripheral portion of the electrode, it may be difficult to efficiently heat the cream solder on the grounding lands. That is, after the cream solder is coated on the grounding lands formed as described above, since heat supplied to the grounding lands may be easily transferred to the peripheral portion of the electrode and the inner ground layer in a process of heating and melting the cream solder in a reflow furnace and the like, the cream solder may not be sufficiently molten, resulting in soldering defects.

In this regard, according to the related art, a pattern shape is employed in which each grounding land is connected to a peripheral conductive member (an annular electrode and the like) through a connection bar with a narrow width radially protruding around the grounding land (for example, refer to Japanese Unexamined Patent Application Publication No. 2003-243813). The grounding land with the connection bar protruding as described above is referred to as a thermal land, and dissipation of heat supplied to the grounding land can be suppressed because the heat is not easily leaked through the connections bar with a narrow width. Further, in the case in which the grounding lands of the outer layer and the inner layer of the multi-layer substrate are formed as the thermal lands, in the outer layer, heat is not easily transferred from the grounding lands coated with the cream solder to the peripheral annular electrodes through the connections bars, and a desired peel strength can be ensured for the grounding lands by covering the annular electrodes with solder resist. In addition, the heat is transferred from the grounding land of the outer layer to the grounding land of the inner layer through the via hole, but leakage of the heat can be suppressed because the heat is transferred to the ground layer and the like through the connection bar in the inner layer. Thus, even if the grounding land of the outer layer is conducted to the large ground layer of the inner layer, the cream solder coated on the grounding land of the outer layer can be efficiently heated in the reflow furnace and the like.

However, for example, in an electronic circuit unit provided with a multi-layer substrate 20 as shown in FIG. 3, if a grounding land 23 of each layer is formed as a thermal land with protruding connection bars 23*a* as shown in FIG. 4, openings 24 partitioned by the connection bars 23*a* in the circumferential direction are formed around the grounding land 23 of each layer. Further, since a high frequency signal may easily pass through between layers in an area in which all openings 24 of each layer overlap each other along the thickness direction (interlayer direction) in the multi-layer substrate 20, when high frequency circuits 21 and 22 are provided on two different layers (the uppermost layer and the undermost layer in FIG. 3) of the multi-layer substrate 20, isolation between the high frequency circuits 21 and 22 is reduced, resulting in an increase in noise intrusion. In FIG. 3, a reference numeral 25 indicates a ground layer, a reference numeral 26 indicates annular electrodes, a reference numeral 27 indicates wiring patterns, a reference numeral 28 indicates a via hole and a reference numeral 29 indicates insulating layers, and solder resist, electrical parts and the like are omitted.

SUMMARY

An electronic circuit unit includes a multi-layer substrate in which high frequency circuits are provided on two different layers and a ground layer is formed between the two layers, and grounding lands connected to peripheral conductive members through connection bars formed on a plurality of layers of the multi-layer substrate, wherein the grounding lands are connected to each other through a via hole and conducted to the ground layer, and the connection bars protruding radially outward from at least two grounding lands provided on different layers are arranged in different directions with respect to a circumferential direction such that the connection bars do not overlap each other along a thickness direction of the multi-layer substrate.

DESCRIPTION OF EXEMPLARY EMBODIMENTS

Figure 1A:
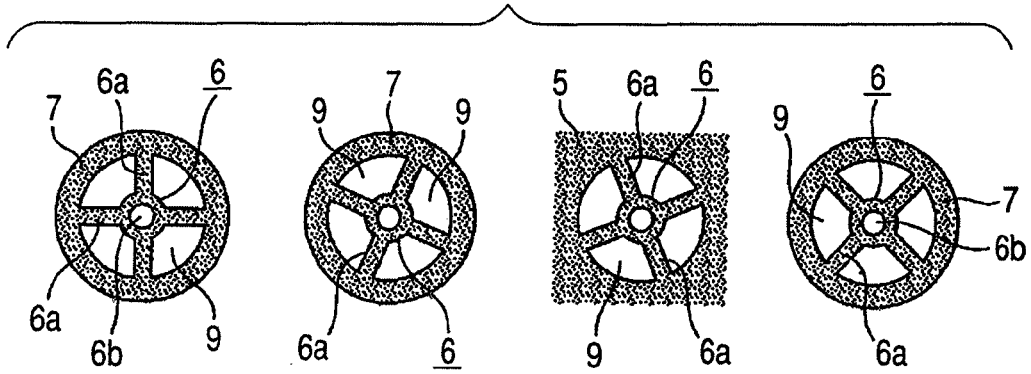
FIGS. 1A and 1B are diagrams illustrating the state in which grounding lands provided on each layer of an electronic circuit unit are arranged in the same direction according to an embodiment of the invention.

Hereinafter, an embodiment of the invention will be described with reference to FIGS. 1A and 1B and 2. An electronic circuit unit 1 shown in FIG. 2 includes a multi-layer substrate 2, and high frequency circuits 3 and 4 are provided on the uppermost layer (first layer) and the undermost layer (fourth layer) of the multi-layer substrate 2. Further, a power circuit and the like are provided on a second layer of the multi-layer substrate 2, and a ground layer (ground conductive layer) 5 is formed on nearly the entire surface of a third layer thereof.

Grounding lands 6 are each provided on each layer of the multi-layer substrate 2 while overlapping along the thickness direction (interlayer direction) of the multi-layer substrate 2. As shown in FIGS. 1A and 1B, since each grounding land 6 is connected to a peripheral conductive member (an annular electrode 7 or the ground layer 5) through a connection bar 6a with a narrow width, the grounding land 6 is formed as a thermal land capable of suppressing heat dissipation. Further, the grounding lands 6 are connected to each other through a via hole 8 formed through the layers, so that they are conducted to the ground layer 5. In FIG. 2, a reference numeral 10 indicates wiring patterns and a reference numeral 11 indicates insulating layers, and solder resist, electrical parts and the like are omitted.

As shown in FIG. 1A, since the grounding lands 6 are each provided with connection bars 6a radially protruding in the four directions at the same interval, openings 9 partitioned by the connection bars 6a in the circumferential direction are formed around the grounding lands 6. Further, the arrangement directions of the connection bars 6a protruding radially from the grounding lands 6 of each layer are different from each other in each layer. Thus, in the state of FIG. 2 in which the grounding lands 6 of each layer overlap each other, it is essential that the opening 9 around each grounding land 6 faces the connection bar 6a of a different layer. Further, an area, in which the openings 9 around the grounding lands 6 of each layer overlap each other along the interlayer direction, is substantially hidden by the connection bars 6a of each layer as shown in FIG. 1B.

In addition, the grounding lands 6 of each layer are formed at the approximate center thereof with a mounting hole 6b. Grounding terminals of electrical parts (not shown) are inserted into the mounting hole 6b so as to be soldered to the grounding land 6 of the outer layer. At this time, since each grounding land 6 is formed as the thermal land with the protruding connection bar 6a, heating efficiency at the time of soldering is improved. That is, in the outer layer of the multi-layer substrate 2, heat is not easily transferred from the grounding land 6 coated with cream solder to the peripheral annular electrode 7 through the connection bar 6a, and a desired peel strength can be ensured for the grounding land 6 by covering the annular electrode 7 with solder resist. In addition, the heat is transferred from the grounding land 6 of the outer layer to the grounding land 6 of the inner layer through the via hole 8, but leakage of the heat can be suppressed because the heat is transferred to the ground layer 5 and the like through the connection bar 6a in the inner layer. Thus, even if the grounding land 6 of the outer layer is conducted to the large ground layer 5 of the inner layer, the cream solder coated on the grounding land 6 of the outer layer can be more efficiently heated in a reflow furnace and the like.

Figure 1B:
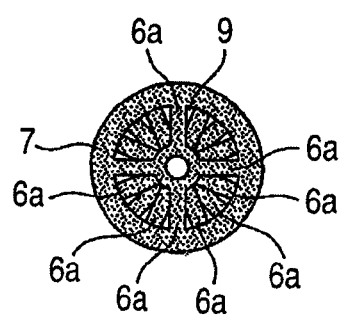
Figure 2:
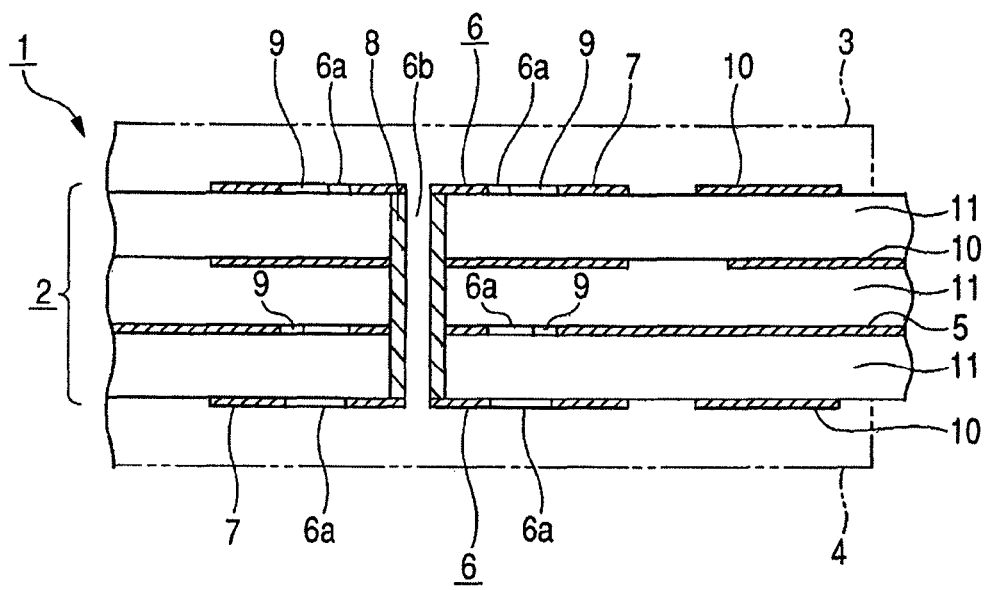
FIG. 2 is a sectional view illustrating main elements of an electronic circuit unit including parts having the grounding lands of FIGS. 1A and 1B.
Figure 3:
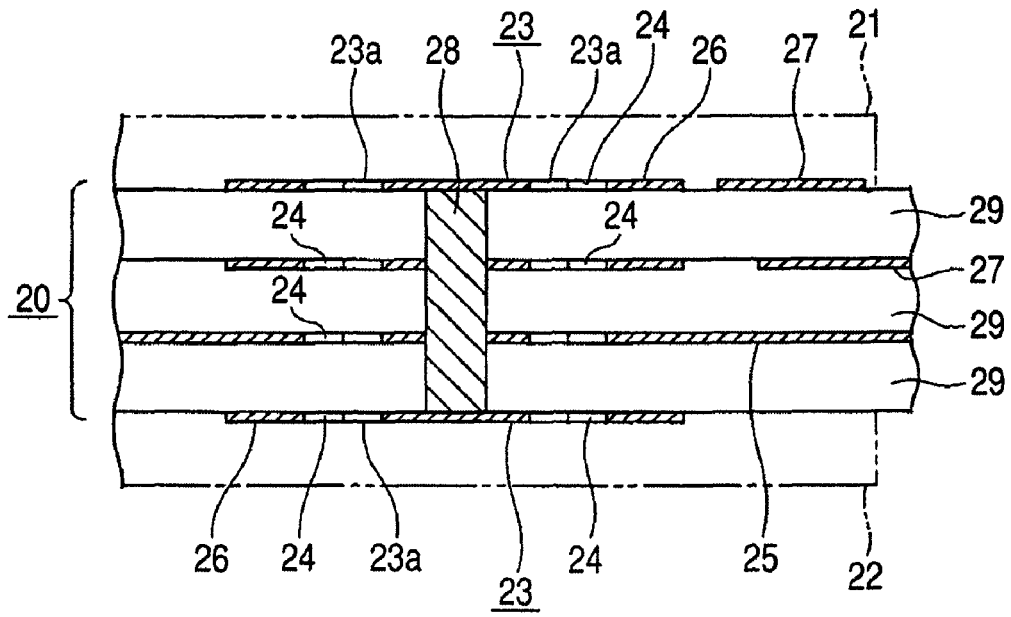
FIG. 3 is a sectional view illustrating main elements of an electronic circuit unit according to the related art.
Figure 4:
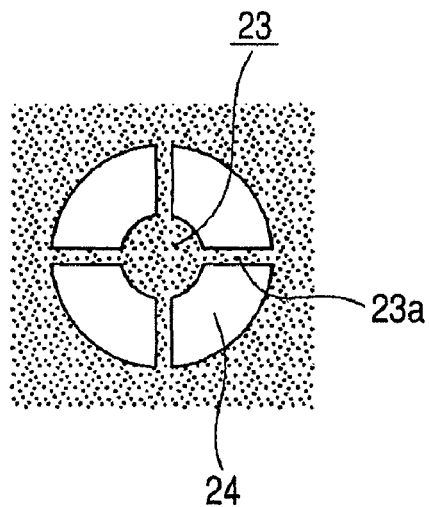
FIG. 4 is a diagram illustrating the shape of a grounding land according to the related art.

As described above, in the electronic circuit unit 1 according to the embodiment of the invention, the arrangement directions of the connection bars 6a protruding radially from the grounding lands (thermal lands) 6 of each layer in the multi-layer substrate 2 are different from each other in each layer, so that the openings 9 around the grounding lands 6 are prevented from overlapping each other in the interlayer direction as shown in FIG. 1B, resulting in a reduction in the probability of a high frequency signal passing through between layers through the openings 9. Consequently, isolation between the high frequency circuits 3 and 4 provided on the uppermost layer and the undermost layer of the multi-layer substrate 2 can be easily ensured, and noise intrusion, which may occur between the high frequency circuits 3 and 4, can be effectively prevented.

Further, according to the embodiment of the invention, the arrangement directions of the connection bars 6a are different from each other in each layer. However, if the connection bars 6a of at least two layers are arranged in different directions with respect to the circumferential direction, isolation between the high frequency circuits 3 and 4 can be enhanced.

In addition, according to the embodiment of the invention, since the grounding lands 6 of each layer in the multi-layer substrate 2 are formed with the mounting hole 6b, the via hole 8 serves as a through via. However, when conductive balls connected to grounding terminals of chip parts and the like are mounted on the grounding land 6 of the outer layer so as to be soldered thereto, the via hole 8 may serve as a blind via without forming the mounting hole 6b in the grounding lands 6 of each layer.

Moreover, according to the embodiment of the invention, the grounding lands 6 are formed as thermal lands on the four layers of the multi-layer substrate 2. However, even if the grounding lands 6 are formed as thermal lands on a plurality of layers such as three layers or five layers or more, effects substantially identical to those of the previous embodiment can be achieved by applying the invention thereto.

It should be understood by those skilled in the art that various modifications, combinations, sub-combinations and alterations may occur depending on design requirements and other factors insofar as they are within the scope of the appended claims or the equivalents thereof.

What is claimed is:

1. An electronic circuit unit,
    a multi-layer substrate having high frequency circuits provided on two different layers and a ground layer disposed between the two layers; and
    grounding lands connected to peripheral conductive members through connection bars on a plurality of layers of the multi-layer substrate,
    wherein the grounding lands are connected to each other through a via hole and conducted to the ground layer, and
    the connection bars that protrude radially outward from at least two grounding lands provided on different layers and are arranged in different directions with respect to a circumferential direction such that the connection bars do not overlap each other along a thickness direction of the multi-layer substrate.

2. The electronic circuit unit according to claim 1, wherein the connection bars protrude radially from the grounding lands of at least three layers, and arrangement directions of the connection bars are different from each other in each layer.

* * * * *